United States Patent [19]
Fonash et al.

[11] Patent Number: 5,275,851
[45] Date of Patent: Jan. 4, 1994

[54] LOW TEMPERATURE CRYSTALLIZATION AND PATTERNING OF AMORPHOUS SILICON FILMS ON ELECTRICALLY INSULATING SUBSTRATES

[75] Inventors: Stephen J. Fonash, State College, Pa.; Gang Liu, Sunnyvale, Calif.

[73] Assignee: The Penn State Research Foundation, University Park, Pa.

[21] Appl. No.: 25,710

[22] Filed: Mar. 3, 1993

[51] Int. Cl.$^5$ .................. H01L 21/324; B05D 3/06
[52] U.S. Cl. .................. 427/578; 427/569; 427/248.1; 427/255.7; 437/233; 437/967; 437/109
[58] Field of Search ........... 427/578, 569, 248.1, 427/255.7; 437/233, 967, 109

[56] References Cited
U.S. PATENT DOCUMENTS 4,772,564 9/1988 Barnett et al. .................. 437/4
5,147,826 9/1992 Liu et al. .................. 437/233

OTHER PUBLICATIONS

Hatalis et al., "Large grain polycrystalline silicon by low-temperature annealing of low-pressure chemical vapor deposited amorphous silicon films", J. Appl. Phys. 63(7), Apr. 1988, pp. 2260-2266.

Iverson et al., "Recrystallization of amorphized polycrystalline silicon films on $SiO_2$: Temperature dependence of the crystallization parameters", J. Appl. Phys. 62(5), Sep. 1987, pp. 1675-1681.

"Examination of the Optimization of Thin Film Transistor Passivation with Hydrogen Electron Cyclotron Resonance Plasmas", R. A. Ditzio et al., J. Vac. Sci. Tech. A 10(1), Jan./Feb. 1992, pp. 59-65.

"Low-Temperature Polycrystalline-Silicon TFT on 7059 Glass", W. Czubatyj et al., IEEE Electron Device Letters, vol. 10, No. 8, Aug. 1989, pp. 349-351.

"Low Thermal Budget Poly-Si Thin Film Transistors on Glass", G. Liu, vol. 30, No. 2B, Feb. 1991, pp. L269-L271.

*Primary Examiner*—Roy King
*Attorney, Agent, or Firm*—Thomas J. Monahan

[57] ABSTRACT

A fabrication process polycrystalline silicon thin film transistors commences with the deposition of an ultrathin nucleating-site forming layer onto the surface of an insulating substrate (e.g., 7059 glass). Next, an amorphous silicon film is deposited thereover and the combined films are annealed at temperatures that do not exceed 600° C. By patterning the deposition of the nucleating site forming material on the glass substrate, the subsequently deposited amorphous film can be selectively crystallized only in areas in contact with the nucleating-site forming material.

12 Claims, 2 Drawing Sheets

LOW TEMPERATURE CRYSTALLIZATION AND PATTERNING OF AMORPHOUS SILICON FILMS ON ELECTRICALLY INSULATING SUBSTRATES

FIELD OF THE INVENTION

This invention relates to a method for crystallizing amorphous silicon films into large grain polycrystalline silicon films and, more particularly, to a method for achieving selective crystallization of such films.

BACKGROUND OF THE INVENTION

Polycrystalline thin film transistors have the potential for extensive applications in large area electronic devices such as flat panel displays and image sensors. Recently, studies of polysilicon thin film transistors have concentrated on methods for reducing their fabrication cost, either by reducing the transistors' processing time or by lowering the processing temperatures. The latter effect is important since it can allow the usage of less expensive substrates for the transistor arrays, e.g., glass, plastic, etc.. For instance, Czubatyj et al. in "Low-Temperature Polycrystalline TFT on 7059 Glass", IEEE Electron Device Letters, Vol. 10, pages 349-351, 1989, demonstrated that polysilicon thin film transistors could be fabricated on 7059 glass substrates using relatively low temperature furnace annealing for crystallization. However, their crystallization process took longer than 75 hours and was therefore not practically applicable.

The inventors hereof in "Low Thermal Budget Poly-Silicon Thin Film Transistors on Glass", Japanese Journal of Applied Physics, Vol. 30, pages L269-L271, 1991 demonstrated that thin film transistors could be fabricated on polysilicon films. Those films were obtained by a rapid thermal annealing of the films for five minutes at 700° C. on 7059 glass substrates.

In U.S. Pat. No. 5,147,826 to Liu et al., the inventors hereof teach that the prior art thermal anneal procedure at 700° C. (for converting amorphous silicon to polycrystalline silicon) can be reduced to a range of from 550° C. to 650° C. This improvement was accomplished by depositing a very thin discontinuous film of a nucleating site forming material over an already deposited layer of amorphous silicon. The two contiguous films were then rapidly thermally annealed, with the nucleating site forming material enabling the crystallization of the underlying amorphous silicon at temperatures lower than had theretofore been reported.

Liu et al. also reported in the '826 patent that the amorphous silicon could be selectively crystallized by depositing the nucleating site performing material in a pattern thereon and subsequently subjecting the patternized surface to an anneal procedure. Because the nucleating site forming material was a metal, the treated surface of the subsequently crystallized silicon was not optimal for structures (having this surface as a boundary for an active region). As a result, additional processing steps were required to allow untreated surfaces to become boundaries for devices to be grown.

Accordingly, it is an object of this invention to provide an improved method for enabling selective crystallization of an amorphous silicon film.

It is another object of this invention to provide a method for crystallizing amorphous silicon films which enables usage of the crystallized film for device application without requiring access to a hidden surface thereof.

It is yet another object of this invention to provide an improved method for selective crystallization of amorphous silicon films which employs an inexpensive substrate as a support therefor.

SUMMARY OF THE INVENTION

A fabrication process for polycrystalline silicon thin film transistors commences with the deposition of an ultra-thin nucleating-site forming layer onto the surface of an insulating substrate (e.g., 7059 glass, plastic). Next, an amorphous silicon film is deposited thereover and the combined films are annealed at temperatures that do not exceed 600° C. By patterning the deposition of the nucleating site forming material on the glass substrate, the subsequently deposited amorphous film can be selectively crystallized only in areas in contact with the nucleating-site forming material.

DETAILED DESCRIPTION OF THE INVENTION

Figure 1:
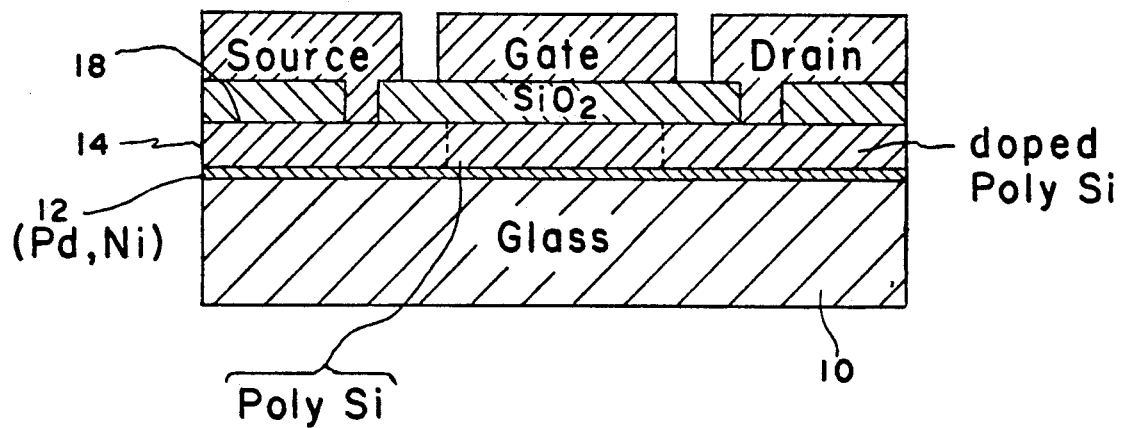
FIG. 1 is a sectional view of a thin film transistor structure made in accordance with the method of the invention.

Referring to FIG. 1, the structure of an n-channel polysilicon thin film transistor is shown in section. Substrate 10 is preferably comprised of borosilicate glass (e.g. 7059 glass, manufactured by the Corning Corporation, Corning, N.Y.). On glass layer 10, an ultra-thin layer of nucleating site forming material 12 is deposited. Preferred nucleating site materials are palladium and nickel. Assuming that palladium is employed as the nucleating site material, an ultra thin layer thereof, (e.g. approximately 10 Angstroms) is deposited on glass layer 10 prior to the subsequent deposition of an amorphous silicon film layer 14. Palladium layer 12 may be deposited through a mask (not shown) or patterned lithographically so that selected areas of the surface of glass layer 10 remain free from the palladium layer 16.

As described in the inventors' U.S. Pat. No. 5,147,826, the ultra-thin palladium layer 12, when deposited on the surface of a plasma-enhanced chemical vapor deposited (PECVD) amorphous silicon film allows the film to be crystallized at a temperature more than 50° C. lower than films without the palladium layer for the same annealing time. However, thin film transistors were not made on the surface containing the palladium layer since palladium metal was present where transistors' channels would be produced.

In this invention as shown in FIG. 1, however, palladium layer 12 is deposited beneath amorphous silicon layer 14 and thus does not effect its uppermost surface 18. Without palladium layer 12, crystallization of layer 14 requires 15 hours at 600° C. However, with an intermediate palladium layer 12 between glass layer 16 and amorphous silicon layer 14, only two hours are required to crystallize the same film at 600° C.

The palladium layers used were nominally (as measured by a crystal thickness monitor) less than or equal to 10 Angstroms. Such layers are not continuous films but are composed of isolated palladium islands on glass substrate 10. Such islands become nucleation enhancing sites for the subsequently deposited amorphous silicon film 14 and thereby reduce its crystalline temperature-time requirement.

After annealing of silicon layer 14, a mask layer 22 is deposited or applied thereon; apertures opened therein to define source and drain contacts and metallization subsequently applied. The aforesaid semiconductor processing steps are not described in detail as they are conventional (once the underlying, selectively crystallized silicon layer 14 is produced).

EXPERIMENTAL

After the Pd ultra-thin film is deposited on the 7059 glass, a 1000 Å plasma enhanced chemical vapor deposited (PECVD) amorphous silicon film was deposited. The base pressure and the processing pressure were $5 \times 10^{-7}$ and 0.5 torr, respectively, during the PECVD step. The rf power was 200 mW/cm$^2$. After the amorphous silicon deposition, the source and drain regions of thin film transistors (TFTs) were defined and implanted with $2 \times 10^{15}$ cm$^{-2}$ phosphorus at 35 KeV. It is at this point that the samples are annealed at 600° C. for 2 hours to crystallize the amorphous silicon films and to activate the dopants. After this annealing, the source/drain sheet resistance reached 5KΩ/sq., which was below the range where it could limit the on-current. Neither peel-off nor cracks were found on the crystallized films under an optical microscope. The size of the glass substrates was 1.5×1.5 inches and no substrate warpage was observed on these samples. However, the lateral shrinkage of these 7059 glass substrates was about 0.1% after this annealing. One can use a glass pre-annealing to avoid this shrinkage for larger area devices. For the same annealing conditions, 2 hours at 600° C., the PECVD amorphous silicon films without the ultra-thin Pd layer did not crystallize and still kept their amorphous structure as noted from TEM observations.

A 1000 Å silicon dioxide film was then deposited by a magnetron sputtering technique. This deposition procedure uses sputtering of a SiO$_2$ target in an Ar/O$_2$ ambient to form the gate dielectric. The base pressure and processing pressure were $10^{-7}$ and $3 \times 10^{-3}$ torr, respectively. The samples were held at 400° C. during the deposition. Finally, contact windows were opened by wet etching, and 1 μm Al film was thermally evaporated to form the source, drain and gate contacts. The TFTs fabricated in this study had a channel length of 7.5 μm and a channel width of 75 μm.

After the TFT structure was completed, the TFTs were passivated using an electron cyclotron resonance (ECR) hydrogen plasma. ECR hydrogenation is an effective passivation technique that can reduce the passivation time (the minimum processing time to reach the optimum TFT performance) from several hours, which is usually required by rf plasma hydrogenation, to times of the order to 10 min. See R. A. Ditizio, G. Liu and S. J. Fonash, "Short Time Electron Cyclotron Resonance Hydrogenation of Poylcrystalline Silicon Thin-Film Transistor Structures", Appl. Phys. Lett. vol. 56(12), pp. 1140-1142, 1990. It is believed that the reduction in passivation time is attributable to higher H and H+ concentrations in the ECR plasma compared to a rf plasma. The base pressure and processing pressure for the ECR hydrogenation were $1 \times 10^{-6}$ and $1.4 \times 10^{-4}$ torr, respectively. The microwave power was 600 W and the substrate temperature was 300° C. during the passivation. The TFTs were passivated using the ECR hydrogen plasma for 10 min.

Figure 2:
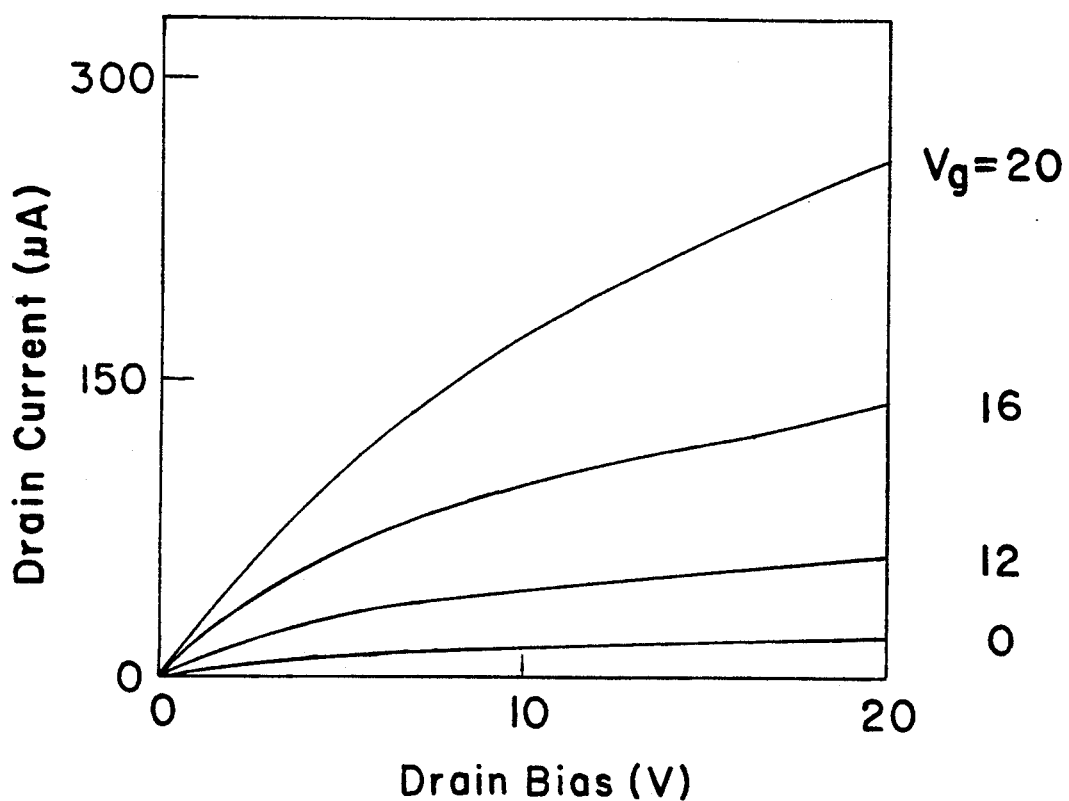
FIG. 2 is a plot of drain current versus drain bias for a thin film transistor made in accordance with the invention.

FIG. 2 shows the output characteristics of TFTs fabricated as described above. The effective mobility of these devices, calculated in the linear region at maximum transconductance, was 20 cm$^2$/V sec. When the same fabrication process was followed, but without the use of the ultra-thin Pd layer, the resulting TFTs had corresponding mobilities that were less than 1 cm$^2$/V sec. Again, this is due to the fact that, without the ultra-thin Pd layer, the PECVD amorphous silicon films would not crystallize after a 600° C./2 hour annealing.

Figure 3:
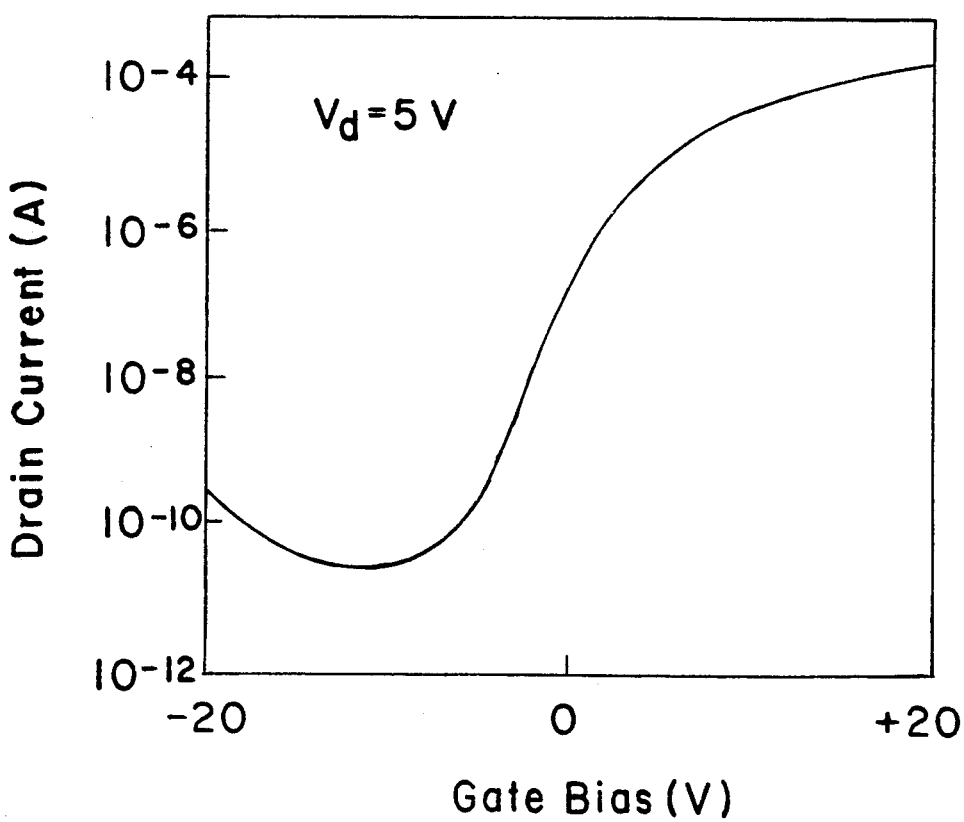
FIG. 3 is a plot of drain current versus gate bias for a thin film transistor made in accordance with the invention.

The subthreshold characteristics are shown in FIG. 3. The inverse subthreshold slope of these TFTs was 1.3 V/decade for a drain bias of 5 V. It is believed that a high interface state density at the Si/SiO$_2$ interface is responsible for the relatively high inverse subthreshold slope. The interface state density calculated from the trapping model was $9 \times 10^{11}$ cm$^{-2}$. The threshold voltage was 2 V where the threshold voltage was defined as the gate bias at which the normalized drain current $I_{dn}(I_{dn}=I_d/(W/L))$ equals $10^{-7}$ A. W is the channel width and L is the channel length. It has been found that TFTs with the ECR hydrogenation usually have a lower threshold voltage than the same TFTs with rf hydrogenation.

Since the off current is often a function of the gate voltage in TFTs, it is convenient to define a minimum off-current as the minimum drain current for gate voltages $\leq 0$ V with a drain bias of 5 V. As shown in FIG. 3, the minimum-off current for the TFTs was in the $10^{-11}$ Ampere range for a channel width of 75 μm, which gives a minimum off-current per unit gate width of 0.5 pA/μm. The on/off current ratio was defined as the ratio between the maximum forward current and the minimum off-current for a gate voltage ranging from $-20$ V to 20 V and a drain vias of 5 V. With this condition the on/off current ratio of these TFTs was in the $10^6$ range.

In summary, a poly-Si TFT fabrication process has been developed that uses a Pd-assisted 600° C. crystallization step and an ECR plasma passivation step. The fabrication process has the advantages of short processing time and low processing temperature. An ultra-thin Pd layer treatment on a 7059 glass substrate can reduce the crystallization time for a PECVD amorphous silicon film at 600° C. from 15 to 2 hours. In addition, the usage of the ECR passivation technique can reduce the passivation time to 10 min. compared to several hours when using a conventional rf plasma passivation. The maximum processing temperature of 600° C. is compatible with the use of the relatively inexpensive 7059 glass substrates. The poly-Si TFTs fabricated on 7059 glass substrates using the process described above had a effective mobility of 20 cm$^2$/V sec., a threshold voltage of 2 V, a minimum off current of 0.5 pA/μm at a drain bias of 5 V, and an on/off current ratio of $10^6$ at a drain bias of 5 V.

It should be understood that the foregoing description is only illustrative of the invention. Various alternatives and modifications can be devised by those skilled in the art without departing from the invention. For instance, while glass has been described as a preferred substrate, an appropriate plastic substrate is also acceptable. In addition appropriate substrate surface coatings may be employed, e.g. Si$_3$N$_4$. Accordingly, the present invention is intended to embrace all such alternatives, modifications and variances which fall within the scope of the appended claims.

What is claimed is:

1. A method for producing a polycrystalline silicon film on an electrically insulating substrate, comprising the steps of:
   (a) depositing on said electrically insulating substrate a thin discontinuous film of a nucleating site forming material;
   (b) depositing an amorphous silicon film on said discontinuous film of nucleating site forming material; and
   (c) annealing the films by heating to a temperature below that which would anneal said amorphous silicon film without said film of nucleating site forming material in contact therewith, whereby said nucleating site forming material allows formation of said polycrystalline silicon film at a lower anneal temperature.

2. The method of claim 1 wherein said nucleating site forming material is selected from the group consisting of palladium and nickel.

3. The method of claim 1 wherein said anneal temperature is approximately at or below 600° C.

4. The method of claim 1 wherein said nucleating site forming material is deposited in a pattern on said electrically insulating substrate.

5. The method of claim 4 wherein said annealing step raises the temperature of said films for a sufficient time to anneal portions of said amorphous silicon film in contact with said nucleating site forming material pattern, said temperature and its time of application insufficient to anneal portions of said amorphous silicon film not in contact with said nucleating site forming material pattern.

6. The method of claim 5 wherein said nucleating site forming material is selected from the group consisting of palladium and nickel.

7. The method of claim 6 wherein said raised temperature is approximately 600° C.

8. The method of claim 7 wherein said temperature is raised for approximately two hours.

9. The method of claim 1, wherein said depositing of said thin discontinuous film is achieved by depositing said thin discontinuous film to a thickness of approximately 50 Angstroms or less, whereby said thin discontinuous film is deposited as independent globules to form said nucleating sites on said electrically insulating substrate.

10. A method for producing a polycrystalline silicon film, comprising the steps of:
    (a) disposing a thin discontinuous film of a nucleating site forming material in contact with a surface of a glass substrate;
    (b) depositing an amorphous film of silicon over said film of nucleating site forming material; and
    (c) annealing the films by heating to a temperature below that which would anneal said amorphous silicon film without said film of nucleating site forming material in contact therewith, whereby said nucleating site forming material allows formation of said polycrystalline film at a lower anneal temperature.

11. The method of claim 10 wherein said glass substrate is 7059 glass.

12. The method of claim 11 wherein said nucleating site forming material is selected from the group consisting of palladium and nickel and is deposited to a thickness of approximately 10 Angstroms on said glass substrate.

* * * * *